United States Patent [19]

Leskovec et al.

[11] Patent Number: 4,584,499

[45] Date of Patent: Apr. 22, 1986

[54] AUTORESONANT PIEZOELECTRIC TRANSFORMER SIGNAL COUPLER

[75] Inventors: Robert A. Leskovec, Richmond Heights; John M. Davenport, Lyndhurst, both of Ohio; Orvar B. Burman, San Mateo, Calif.

[73] Assignee: General Electric Company, Schenectady, N.Y.

[21] Appl. No.: 722,480

[22] Filed: Apr. 12, 1985

[51] Int. Cl.⁴ .............................................. H01L 41/08
[52] U.S. Cl. .................................... 310/318; 310/366; 310/352; 310/319
[58] Field of Search .............. 310/314, 324, 316–319, 310/351–353, 348, 366

[56] References Cited

U.S. PATENT DOCUMENTS

| | | | |
|---|---|---|---|
| 3,500,089 | 3/1970 | Brech et al. | 310/316 |
| 3,657,579 | 4/1972 | Kramer | 310/318 |
| 3,659,123 | 4/1972 | Oya | 310/318 |
| 3,676,724 | 7/1972 | Berlincourt et al. | 310/318 |
| 3,691,410 | 9/1972 | Kawada | 310/318 |
| 3,736,446 | 5/1973 | Berlincourt et al. | 310/318 |
| 3,764,848 | 10/1973 | Berlincourt | 310/366 X |
| 4,004,409 | 1/1977 | Ganter | 310/324 X |
| 4,392,074 | 7/1983 | Kleinschmidt et al. | 310/318 X |
| 4,469,975 | 9/1984 | Nakamura et al. | 310/353 X |

FOREIGN PATENT DOCUMENTS 7532009  5/1976  France ................... 310/366

Primary Examiner—Mark O. Budd
Attorney, Agent, or Firm—J. F. McDevitt; Philip L. Schlamp; Fred Jacob

[57] ABSTRACT

A piezoelectric transformer signal coupler utilizes a drive circuit including an oscillator constructed to excite the primary of a piezoelectric transformer at its characteristic anti-resonant frequency. Positive feedback signals modulated by the time domain response characteristic of the particular piezoelectric transformer force the oscillator to lock onto its characteristic anti-resonant frequency despite variations thereof due to temperature drift and secondary loading. The resulting drive circuit is implementable as a miniature, low mass integrated circuit mountable on the transformer's piezoceramic wafer to create a signal coupler of a single integrated structure.

33 Claims, 8 Drawing Figures

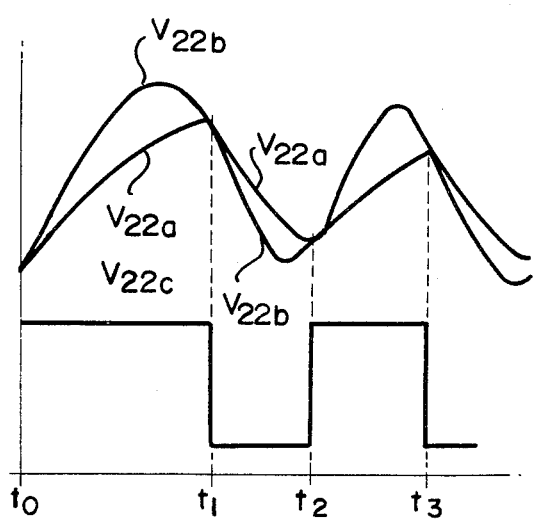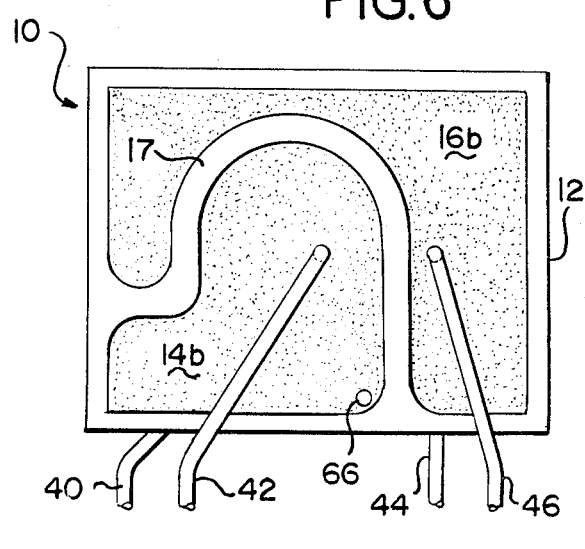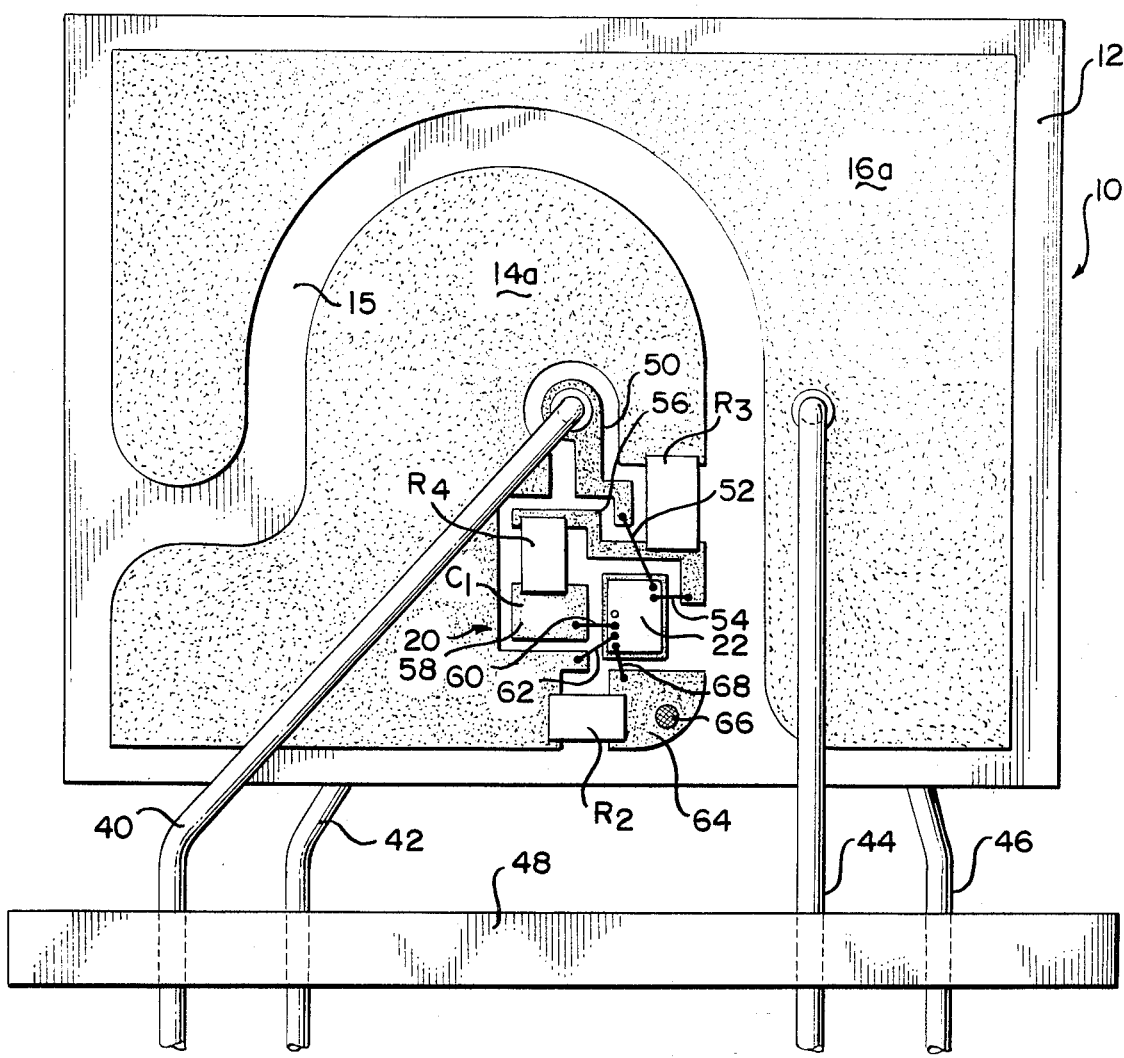

AUTORESONANT PIEZOELECTRIC TRANSFORMER SIGNAL COUPLER

The present invention relates generally to signal coupling devices and more particularly to a drive circuit for a piezoelectric transformer signal coupling element.

Historically, signal coupling devices have utilized magnetic transformers to achieve voltage and/or current compatibility between diverse electronic circuits such as microprocessor control circuitry and power semiconductor controlled circuitry, as well as requisite electrical isolation therebetween. While magnetic isolation transformers are eminently suited for this purpose from a functional standpoint, they have the distinct drawback of being relatively bulky and thus do not lend themselves to circuit miniaturization. Moreover, magnetic transformers, consisting of a core, bobbin and copper wire, call for a rather elaborate manufacturing process.

Recently, it has been proposed to utilize piezoelectric devices implemented in a transformer configuration as signal isolation devices. One such proposal is the piezocoupler disclosed in recently issued U.S. Pat. No. 4,392,074. Earlier disclosures of load coupling piezoelectric transformers may be found in U.S. Pat Nos. 3,679,918; 3,691,410 and 3,736,446. Piezoelectric transformers are basically rather simple devices comprising a ceramic wafer of a suitable material such as lead zirconate titanate to which are applied separate electrode regions, typically in opposed surface relation. Leads connected with input drive circuitry and output load circuitry are applied to these electrode regions which are sized and located in a manner to obtain the desired current, voltage or impedance transformation from the input side to the output side of the piezoelectric transformer.

Heretofore, the driving oscillator circuit has been designed to excite a piezoelectric device at its natural mechanical resonant frequency, which is largely determined by the dimensions of the wafer. Operation of a piezoelectric transformer at its natural resonant frequency provides the highest efficiency and thus maximum power transfer. Since a piezoelectric device exhibits a sharp resonance characteristic, it must be driven by an oscillator operating very close to that frequency. Normal manufacturing tolerances encountered in fabricating piezoelectric transformers result in each device having a somewhat different resonant frequency. The same can be said for oscillators in terms of their operating frequencies. Consequently, each oscillator needs to be carefully tuned to the precise resonant frequency of the piezoelectric transformer with which it is paired. This is a costly procedure and is less than satisfactory since it can not account for the fact that the resonant frequency of the piezoelectric transformer and the operating frequency of the oscillator both drift with variations in temperature. Although it is possible to design an oscillator with frequency drift characteristics tracking those of a piezoelectric device, initial oscillator tuning would still be required.

It is accordingly an object of the present invention to provide an improved piezoelectric transformer signal coupler.

An additional object is to provide a signal coupler of the above character which utilizes an improved drive circuit for a piezoelectric transformer.

Another object is to provide a signal coupler of the above-character wherein the improved drive circuit automatically adjusts its driving frequency to a desired piezoelectric transformer operating frequency.

A further object is to provide a signal coupler of the above-character which utilizes a piezoelectric transformer drive circuit having minimal electrical power requirements.

Another object of the present invention is to provide a signal coupler of the above character which is capable of being powered exclusively by low voltage logic signal inputs.

A still further object of the present invention is to provide a signal coupler of the above-character having a drive circuit capable of implementation in an exceptionally low mass integrated circuit chip.

Yet another object of the present invention is to provide a signal coupler of the above-character wherein the piezoelectric transformer drive circuit is capable of promptly establishing and sustaining its driving output at a frequency precisely tuned to a desired piezoelectric transformer characteristic frequency regardless of variations in temperature and transformer loading.

Other objects of the invention will in part be obvious and in part appear hereinafter.

SUMMARY OF THE INVENTION

In accordance with the present invention, there is provided a piezoelectric transformer signal coupler which utilizes a drive circuit having an oscillator structured to automatically adjust its drive frequency to match a predetermined piezoelectric transformer characteristic frequency. This frequency tuning adjustment is achieved by deriving feedback signals from the piezoelectric transformer which are utilized in forcing the oscillator to lock onto the predetermined transformer characteristic frequency. By virtue of this approach, initial oscillator tuning is avoided, and frequency drift from whatever cause is accommodated.

As an important feature of the present invention, the piezoelectric transfer is operated at its anti-resonant frequency, rather then its natural resonant frequency as in prior art approaches. Consequently, the piezoelectric transformer presents its maximum possible impedance to the drive circuit, rather than its minimum possible impedance as is the case during resonant frequency operation. Driving current is at a minimum for anti-resonant frequency operation, and therefore the driving circuit requires minimal operating power and very modest current handling capabilities. In fact, as a significant benefit of the present invention, drive circuit operating power is derived exclusively from low voltage logic signals effective in triggering the drive circuit into operation. Consequently, the present invention is eminently suited as an isolating signal coupler for interfacing, for example, microprocessor control circuitry with a controlled semiconductor power switch, SCR, TRIAC, and the like. Also, because of the minimal power handling requirements of the drive circuit, it is susceptible to fabrication on a single silicon chip of extremely low mass, so much so that it can in fact be mounted directly on the ceramic wafer of the piezoelectric transformer without prejudice to its mechanical response characteristics.

More specifically, the drive circuit utilizes, in accordance with the present invention, an integrated circuit operational amplifier having an input for accepting a low level logic pulse to initiate oscillation, an output connected to excite the piezoelectric transformer, and both positive and negative feedbacks for supplying signals to assure unambiguous startup and to sustain oscillating excitation at a frequency locked to the anti-resonant frequency of the transformer. These feedback signals are derived without resort to a separate feedback electrode on the piezoelectric wafer. Full anti-resonant frequency operation is achieved in as short a time as three half cycles and full amplified oscillations after sixteen cycles. Oscillation drive continues for the duration of the input logic pulse, as does the transformer output which is well suited to trigger a semiconductor power switch into conduction.

The invention accordingly comprises the features of construction and arrangement of parts which will be exemplified in the construction hereinafter set forth, and the scope of the invention will be indicated in the claims.

For a better understanding of the nature and objects of the invention, reference should be had to the following detailed description taken in conjunction with the accompanying drawing in which:

FIG. 4 illustrates voltage waveforms developed during the operation of the signal coupler of FIG. 3;

FIG. 5 is a front plan view of the signal coupler of FIG. 3 packaged as a single, integrated structure; and FIG. 6 is a back plan view of the integrated structure of FIG. 5.

Corresponding reference numerals refer to like parts throughout the several views of the drawings.

DETAILED DESCRIPTION

Figure 2A:
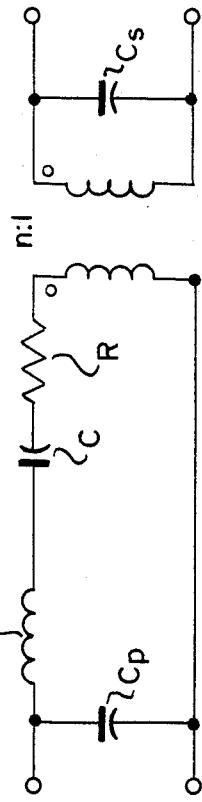
FIGS. 2A, 2B and 2C are simplified equivalent circuit diagrams of the piezoelectric transformer of FIG. 1.
Figure 1:
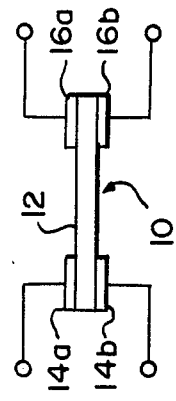
FIG. 1 is a diagrammatic representation of a piezoelectric transformer.
Figure 2B:
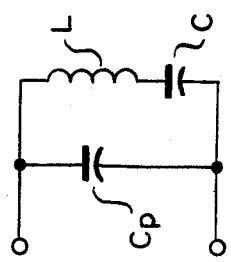
Figure 2C:
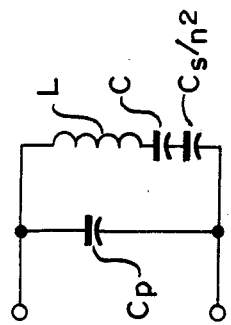

FIG. 2A is an idealized equivalent circuit of a piezoelectric transformer generally indicated at 10 in FIG. 1. This transformer includes a piezoceramic wafer 12 having electrodes 14a and 14b applied to opposed surface regions thereof and electrodes 16a and 16b applied to different opposed wafer surface regions. As is well understood in the art, an alternating voltage or pulse imposed across electrodes 14a and 14b excites an acoustical wave in wafer 12 and the resulting mechanical strain in the piezoceramic material generates a voltage appearing across electrodes 16a and 16b. Thus, electrodes 14a, 14b may be considered as the primary side of transformer 10, and electrodes 16a, 16b its secondary side. In the equivalent circuit of FIG. 2A the inductance L, capacitance C and resistance R are electrical analogs of the mechanical parameters of wafer 12, while capacitances $C_s$ and $C_p$ are dielectric capacitances. With the intended application of transformer 10 in a signal coupler to transform low level logic signals into control signals for bipolar and MOS power switching devices, the equivalent circuits associated with shorted and open secondaries are most relevant. As seen in FIGS. 2B (shorted) and 2C (open), the equivalent circuits in both cases reduce to essentially the same form viewed from the primary, input side, with resonance characteristics dominated by the wafers mechanical parameters inductance L and capacitance C, inasmuch as the resistance R is negligible and can be neglected. There are two characteristic frequencies for a piezoelectric device; one being a frequency of minimum impedance defined as the resonant frequency (series resonance), and a frequency of maximum impedance defined as the anti-resonant frequency (parallel resonance). Heretofore, piezoelectric devices have been operated at their resonant frequency. However, in accordance with the present invention, piezoelectric transformer 10 is operated at its anti-resonant frequency. Operation at this frequency constitutes a well-defined operating point, and, at this frequency, the transformer presents a desirable high input impedance characteristic. Transformer operation is thus achieved with low level current inputs, the benefits of which will be made apparent below.

Figure 3:
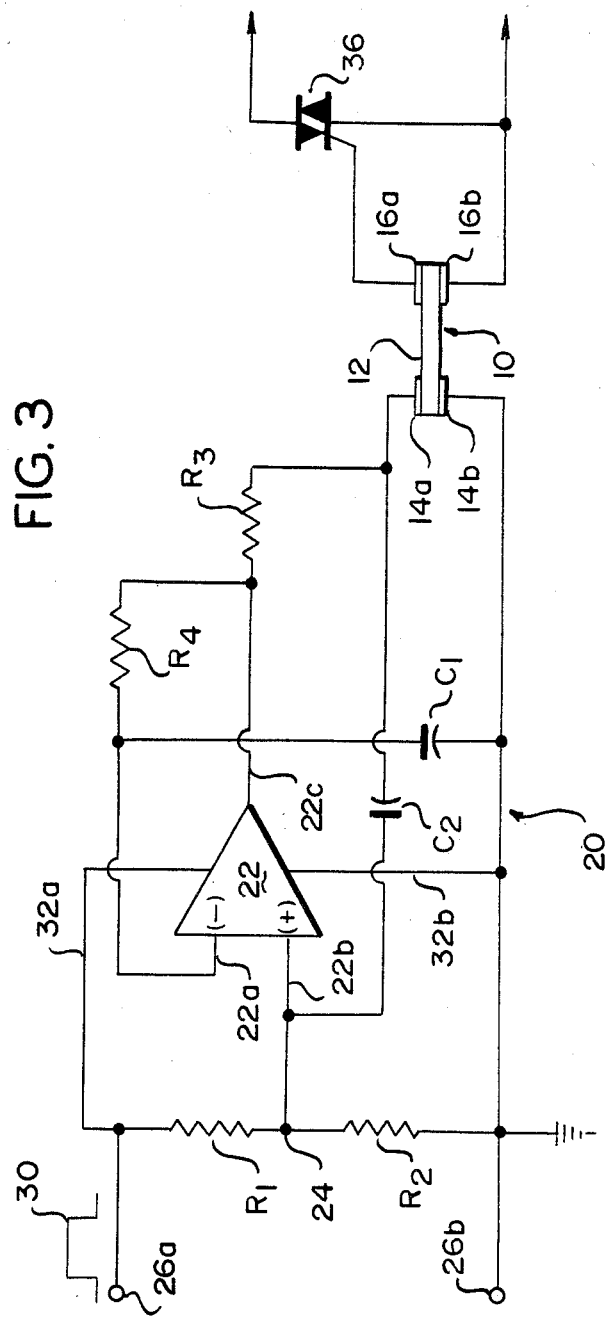
FIG. 3 is a circuit schematic diagram of an autoresonant piezoelectric transformer signal coupler constructed in accordance with the present invention.

FIG. 3 shows a drive circuit, generally indicated at 20, for exciting piezoelectric transformer 10 at its characteristic anti-resonant frequency. As will be seen, drive circuit 20 is capable of adjusting its drive frequency to match a transformer's anti-resonant frequency over a wide range of drive circuit parameters, piezoelectric device parameters, and environmental conditions. Consequently, tolerances associated with piezoelectric transformer fabrication and drive circuit component selections are relaxed, and frequency drift due to temperature changes and component aging is of no consequence.

As seen in FIG. 3, drive circuit 20 utilizes as its single active component an operational amplifier 22 which is preferably implemented in an integrated circuit chip. Examples of suitable op-amp ICs are the Intersil 7555, the Motorola MC34001P, and the Texas Instrument TL-081. Amplifier 22 includes an inverting input 22a, a non-inverting input 22b and an output 22c. Non-inverting input 22b is connected to the junction 24 between a pair of resistors R1 and R2 of a voltage divider connected across input terminals 26a, 26b. Amplifier output 22c is connected through a resistor R4 to electrode 14a of piezoelectric transformer 10, while opposed electrode 14b is connected to a suitable reference potential such as ground, as is input terminal 26b. Amplifier inverting input 22a is connected by resistor R4 to amplifier output 22c and to ground through capacitor C1; this resistor and capacitor constituting an RC network included in a negative feedback path for op-amp 22. Positive feedback is provided through capacitor C2, which serves as a high blocking impedance at DC and a relatively low impedance at the driving frequency.

To initiate operation of drive circuit 20, a low level positive logic pulse 30 is applied across input terminals 26a, 26b. By virtue of connections 32a, 32b, this logic pulse also supplies the operating power for operational amplifier 22. Assuming resistors R1 and R2 to be equal valued, one-half of the logic pulse positive voltage is applied to non-inverting input 22b. With operational amplifier 22 functioning in the disclosed drive circuit as a voltage comparator, the voltage at its output 22c goes high and stays high as long as the voltage at its non-inverting input 22b is more positive than the voltage at its inverting input 22a. Thus, upon receipt of a pulse 30, the amplifier output voltage abruptly goes high since the uncharge condition of capacitor C1 retards the build up of positive voltage at amplifier inverting input 22a. It is seen that this positive-going step voltage at amplifier output 22c is dropped across resistor R3 and applied across electrodes 14a, 14b to excite the primary of piezoelectric transformer 10 and also drives current through resistor R4 to begin charging capacitor C1. The parameters of this RC network are chosen such that the voltage at inverting input 22a rises less rapidly than the voltage at non-inverting input 22b, and therefore the amplifier output voltage stays high. These relative voltage conditions are shown in FIG. 4, where time $t_0$ represents the arrival of the leading edge of a logic pulse 30, and the voltage waves V22a, V22b, and V22c represent the voltages at the correspondingly reference amplifier inputs and output. As is depicted, the voltage V22b appearing at the non-inverting input rises more rapidly than the voltage V22a appearing at the inverting input up to a point in time when the former begins to fall. This falloff is characteristic of the response of a parallel resonant circuit to a step function voltage, which is the response of transformer 10 as coupled in positive feedback fashion to non-inverting input 22b via capacitor C2. When at time $t_1$ in FIG. 4 the voltage V22b falls below the rising voltage V22a, the amplifier output voltage V22c undergoes a negative-going step transition to a low state near zero volts. This produces complementary responses from the RC network and the piezoelectric transformer, as seen in FIG. 4. That is, capacitor C1 discharges through resistor R4, causing the voltage V22a at amplifier input 22a to fall. The response of transformer 10, reflected in the voltage appearing at amplifier input 22b, is of an inverted, but similar voltage waveshape as appeared during the interval $t_0-t_1$. At time $t_2$, the voltage at non-inverting input 22b becomes more positive than the inverting input voltage, and the amplifier output voltage V22c executes a positive-going step voltage transition to its high state. The cycle repeats pursuant to generating sustained oscillations. While the period of the first positive-going cycle is lengthened due to the initially uncharge states of capacitor C1 and transformer 10, the periods of subsequent transitions quickly become equal and as essentially determined by the responses of these two networks at the amplifier transition points.

An important feature of the drive circuit is that the frequency of oscillation is dominated by the time domain response characteristic of the particular piezoelectric transformer being driven, and thus the time constant of the RC network may vary over a relatively wide range with negligible affect on operating frequency. In other words, it is the positive feedback signals, as modulated by the piezoelectric transformer response to the step function amplifier output voltage that predominates in determining operating frequency, rather than the negative fedback signals which are dependent on the RC network time constant. The drive circuit thus locks onto the transformer's anti-resonant frequency where the amplifier supply current is a minimum and the positive feedback, as modulated by the impedance characteristics of the transformer, is a maximum. Thus, it is only necessary to establish an RC network time constant of a nominal value to sustain oscillation with piezoelectric transformers of considerably different anti-resonant frequencies. This is the case regardless of transformer secondary loading. An inductive load tends to raise the operating frequency, and a capacitive load tends to lower it. The result is an extremely stable operating point occurring essentially at the transformer's anti-reasonant frequency.

Another important feature of the drive circuit 20 is that it always begins operation in a predetermined manner upon receipt of each logic pulse 30. Upon termination of the last logic pulse, oscillation ceases, and any charge on capacitor C1 is drained away. Thus, upon arrival of the next logic pulse, this capacitor is uncharged, and the voltage at amplifier inverting input 22a is zero. Consequently, the first appearance of the logic pulse voltage at non-inverting input 22b triggers the amplifier to its high output state, and the drive circuit consistently swings into oscillation in the manner described above.

As shown in FIG. 3, the output voltage developed across secondary electrodes 16a, 16b is utilized to directly trigger a TRIAC 36 pursuant to controllably switch AC power to any desired load (not shown). It will be appreciated that this secondary voltage is totally isolated from the primary, exciting voltage impressed across transformer primary electrodes 14a, 14b thus rendering the disclosed signal coupler ideal for applications where low voltage AC or DC control circuitry operates at a potential considerably different from the switching devices controlling the high power loads. While a TRIAC is shown, the switching device may take other forms, such as, for example, an SCR, an MOS power switch, etc. In the application shown in FIG. 3, the signal coupler functions basically as DC to AC inverter, whose repetitive pulse out is utilized directly as a power switch triggering input. Also, the secondary output can be rectified using a half wave doubler to produce a DC isolated, low current output.

As noted above, operation of piezoelectric transformer 10 at its anti-resonant frequency, maximum input impedance point minimizes the drive circuit output current and thus the power consumption of operational amplifier 22 can be exceedingly low. For example, the typical current drawn by a Texas Instrument TL-081 op-amp at five volts is only 1.2 milliamps, well within the capacity of low level logic circuitry generating the pulses 30. The minimal power handling requirements of the operational amplifier, coupled with the few number of associated components, not one of them being an inductor, creates a drive circuit 20 of extremely low mass and small size susceptible to being packaged as a four-terminal, hybrid integrated circuit device and mounted directly on the piezoelectric transformer wafer 10, as shown in FIG. 5. It is found that anti-resonant operation of the piezoelectric transformer is not adversely affected, even though the drive circuit is physically coupled to the transformer's mechanical circuit. That is, the dynamic loading imposed by the physical presence of the drive circuit typically changes the characteristic anti-resonant frequency by one percent or less, a change the drive circuit is readily able to adjust to.

Referring specifically to FIG. 5, piezoelectric transformer 10 is illustrated having a thin rectangular substrate or wafer 12 of suitable dimensions such as, for example, $2 \times 1.5 \times 0.0152$ centimeters. Electrodes 14a and 16a are depicted as metallized coatings applied to one major surface of the wafer. These conductive electrode regions are separated by a gap 15 of non-coated wafer surface to provide the requisite isolation therebetween. Electrodes 14b and 16b are applied to the opposite major surface of wafer 2 in a corresponding pattern, as illustrated in FIG. 6, with isolation gap 17 therebetween. Preferably, the piezoceramic wafer is mounted in suspension by compliant leads 40, 42, 44 and 46 supported by a suitable insulative member or enclosure part 48 in the manner taught in commonly assigned, copending application entitled "Piezoelectric Transformer Device", Ser. No. 551,452, filed Nov. 14, 1983. Carved out of a portion of electrode region 14a is a conductor pattern created in printed circuit fashion to provide conductor runs electrically interconnecting the various components of the drive circuit, which is also generally indicated at 20 in FIG. 5.

In practice, it has been found that, for most applications, drive circuit 20, as illustrated in FIG. 3, can be implemented with a direct electrical connection from input terminal 26a to amplifier non-inverting input 22b, thus eliminating the need for voltage dropping resistor R1. It was also found that the drive circuit functions satisfactorily with the elimination of capacitor C2 from the positive feedback path. With these simplifications in mind and returning to FIG. 5, it is seen that compliant lead 40 is solder connected to a conductor run 50, which corresponds to input terminal 26a in FIG. 3. Reference numeral 52 designates a wire bond connecting this conductor run to a common non-inverting input positive power supply terminal for operational amplifier chip 22. Wire bond 54 connects the amplifier output to a conductor run 56 going to resistors R3 and R4, which may be polymer based resistors. As seen in both FIGS. 3 and 5, resistor R3 applies the amplifier output to electrode region 14a to excite the primary of transformer 10, while resistor R4 conveys charging current to capacitor C1. It has been found that this capacitor can utilize the dielectric provided by a portion of the wafer cross-section, and thus is advantageously implemented as a conductor pad 58 capacitively coupled with opposed surface electrode 14b. As seen in FIG. 6, electrode region 14b is solder connected with grounded compliant lead 42, which conforms with the circuit diagram of FIG. 3.

Still referring principally to FIG. 5, conductor pad 58 of capacitor C1 is connected by wire bond 60 to the amplifier inverting input, while wire bond 62 constitutes the direct wire connection between electrode region 14a and the amplifier non-inverting input. Discrete resistor R2 is seen connected between electrode region 14a and a conductor pad 64 which is connected via a metal-lined hole 66 through wafer 12 to opposed electrode region 14b. Finally wire bond 68 connects the amplifier negative supply terminal to grounded conductor pad 64. Completing the construction shown in FIGS. 5 and 6, compliant lead 44 is connected to electrode region 16a, and compliant lead 46 is connected to electrode region 16b.

From the foregoing description of FIGS. 5 and 6, it is seen that the signal coupler of FIG. 3 can be packaged as a single, integrated structure of exceedingly small size with drive circuit 20, sans resistor R1 and capacitor C2 of FIG. 3, mounted to the piezoelectric transformer wafer 12. The mounting location is preferably as close to the center of the wafer as practical, where a vibrational node exists.

While the disclosed integrated structure implemented signal coupler operates at the anti-resonant frequency of the piezoceramic transformer, it is envisioned that a piezoceramic wafer mountable drive circuit could be devised for exciting the transformer at its resonant frequency.

It will thus be seen that the objects set forth above among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described the invention, what is claimed as new and desired to secure by Letters Patent is:

1. A signal coupler comprising, in construction:
   A. a piezoelectric transformer having a piezoceramic wafer to which are applied a pair of primary electrodes;
   B. a drive circuit including an oscillator connected with said primary electrodes to apply an oscillating voltage across said wafer, said oscillator including feedback means connected with one of said primary electrodes for controllably tuning said oscillator such that the frequency of said oscillating voltage is maintained substantially equal to the characteristic anti-resonant frequency of said wafer.

2. The signal coupler defined in claim 1, wherein said oscillator is an amplifier and said feedback means includes both positive and negative feedback paths.

3. The signal coupler defined in claim 1, wherein said oscillator is in the form of a low-mass, integrated circuit physically mounted on said wafer.

4. The signal coupler defined in claim 3 wherein said primary electrodes are in the form of first and second conductive coatings applied to opposing surfaces of said wafer, and said oscillator including a printed circuit conductor pattern applied to a surface of said wafer for electrically connecting components of said oscillator to each other and to said first and second electrodes.

5. The signal coupler defined in claim 4, wherein said oscillator includes a capacitor utilizing a cross-section of said wafer as its dielectric.

6. The signal coupler defined in claim 4, wherein said conductor pattern includes an electrically conductive plated hole through said wafer for connecting said oscillator to said second electrode.

7. The signal coupler defined in claim 4, which further includes at least a pair of compliant electrical leads having corresponding one ends affixed to said wafer in electrical connection with said conductor pattern and one of said secondary electrode, said leads mounting said wafer in suspension.

8. A signal coupler comprising, in combination:
   A. a piezoelectric transformer having primary electrodes and secondary electrodes applied to surfaces of a piezoceramic wafer, said secondary electrodes for connection to a load; and
   B. a drive circuit including
      (1) an amplifier having an output connected with one of said primary electrodes and operating in response to a voltage pulse input to apply a step voltage across said primary electrodes to excite said piezoelectric transformer;
      (2) an RC network connected in a negative feedback path for said amplifier for deriving a negative feedback signal and
      (3) a positive feedback path for said amplifier, said positive feedback path deriving a positive feedback signal modulated by the response of said piezoelectric transformer to said step voltage, said positive and negative feedback signals controlling said amplifier to apply an oscillating voltage across said primary electrodes of a frequency substantially equal to the anti-resonant frequency of said piezoelectric transformer for the duration of said voltage pulse input.

9. The signal coupler defined in claim 8, wherein said amplifier is an integrated circuit operational amplifier having an inverting input and a non-inverting input, said negative feedback signal being applied to said inverting input, and said voltage pulse input and said positive feedback signal being applied to said non-inverting input.

10. The signal coupler defined in claim 9, wherein said amplifier is connected to derive its operating power exclusively from said voltage pulse input.

11. The signal coupler defined in claim 9, wherein said RC network includes a resistor and a capacitor, said capacitor residing in an uncharged state while awaiting the arrival of each said voltage pulse input.

12. The signal coupler defined in claim 9, wherein said drive circuit further includes a resistor connected between said amplifier output and said one primary electrode, said negative feedback path connected from the junction of said amplifier output and said resistor to said inverting input, and said positive feedback path connected from the junction of said resistor and said one primary electrode to said non-inverting input.

13. The signal coupler defined in claim 12, wherein said drive circuit further includes a DC blocking capacitor serially connected in said positive feedback path.

14. A drive circuit for a piezoelectric transformer having first and second primary electrodes applied to surfaces of a piezoceramic wafer, said drive circuit comprising, in combination:
A. an oscillator having an input circuit for receiving a DC pulse input and an output circuit connected to apply an oscillating voltage across said primary electrodes;
B. first means connected between said input and output circuits for triggering said oscillator into oscillation upon receipt of said pulse input and for sustaining said oscillating voltage for the duration of said pulse input; and
C. second means connected between said input and output circuits for synchronizing the oscillation of said oscillator such that the frequency of said oscillating voltage is substantially equal the characteristic anti-resonant frequency of the piezoelectric transformer.

15. The drive circuit defined in claim 14, wherein said input circuit is connected to supply operating power to said oscillator solely from said DC pulse input.

16. The drive circuit defined in claim 14, wherein said oscillator comprises an integrated circuit operational amplifier having an inverting input connected with said first means, a non-inverting input connected with said second means and an output connected by said output circuit to one of the primary electrodes, and said input circuit is connected to apply said pulse input to said non-inverting input.

17. The drive circuit defined in claim 16, wherein said output circuit includes a first resistor connecting said amplifier output to said one primary electrode and said input circuit includes a second resistor electrically connected between said non-inverting input and the other one of the primary electrodes, the voltage of said pulse input being developed across said second resistor.

18. The drive circuit defined in claim 17, wherein said first means includes a first feedback path connected between said output and said inverting input of said amplifier and an RC network connected with said first feedback path.

19. The drive circuit defined in claim 18, wherein said second means includes a second feedback path connected between the junction of said first resistor with said one primary electrode and said non-inverting input, said second feedback path carrying a signal modulated by the mechanical response of the piezoelectric transformer for regulating the oscillations of said amplifier and the frequency of said oscillating voltage relatively independently of the time constant of said RC network.

20. The drive circuit defined in claim 19, wherein said second means further includes a capacitor serially connected in said second feedback path.

21. A signal coupler comprising, in combination:
A. a piezoceramic substrate;
B. discrete primary and secondary electrodes in the form of separate conductive coatings applied to opposed surfaces of said substrate;
C. an electrical conductor pattern disposed on at least one surface of said substrate; and
D. a drive circuit having active and passive components mounted on said substrate and variously electrically connected with said conductor pattern and said primary electrodes, said drive circuit applying an oscillating input voltage across said primary electrodes pursuant to developing an oscillating output voltage across said secondary electrodes.

22. The signal coupler defined in claim 21, wherein said drive circuit is constructed to develop said input voltage at a frequency corresponding to a characteristic frequency of said substrate.

23. The signal coupler defined in claim 22, wherein the frequency of said input voltage is substantially equal to the characteristic anti-resonant frequency of said substrate.

24. The signal coupler defined in claim 21, wherein at least one of said passive components of said drive circuit is a capacitor utilizing a cross-section of said substrate as its dielectric.

25. The signal coupler defined in claim 21, which further includes compliant leads having corresponding one ends variously affixed in separate electrical connections with said electrodes and said conductor pattern, said leads mounting said substrate in suspension.

26. The signal coupler defined in claim 22, wherein said drive circuit includes as a single active component an integrated circuit operational amplifier having inverting and non-inverting inputs and an output.

27. The signal coupler defined in claim 26, wherein said drive circuit further includes positive and negative feedback paths including some of said passive components and portions of said conductor pattern, said feedback paths conveying signals to said amplifier inputs such as to induce said amplifier to operate as an oscillator developing at said amplifier output said input voltage at a frequency substantially equal to the anti-resonant frequency of said substrate.

28. The signal coupler defined in claim 27, wherein said positive feedback path is connected between one of said primary electrodes and one of said amplifier inputs whereby the signal conveyed by said positive feedback path is modulated by the mechanical response of said substrate to said input voltage pursuant to regulating the frequency thereof.

29. The signal coupler defined in claim 28, wherein said positive feedback path is connected to said non-inverting input and said negative feedback path is connected between said output and said inverting input of said amplifier.

30. The signal coupler defined in claim 29, wherein said drive circuit further includes an RC network connected with said negative feedback path.

31. The signal coupler defined in claim 30, wherein said drive circuit further includes a first resistor connected between said amplifier output and said one primary electrode.

32. The signal coupler defined in claim 31, wherein said drive circuit further includes a second resistor connected to said non-inverting input and the other one of said primary electrodes, a signal voltage developed across said second resistor being capable of triggering said amplifier into oscillation.

33. The signal coupler defined in claim 32, wherein said second resistor is further connected to apply said signal voltage as operating power for said amplifier.

* * * * *